United States Patent

Evans et al.

[11] 3,965,295
[45] June 22, 1976

[54] PROTECTIVE SYSTEM FOR STEREO LOUDSPEAKERS

[75] Inventors: Ronald C. Evans; Sidney A. Corderman, both of Binghamton, N.Y.

[73] Assignee: McIntosh Laboratory, Inc., Binghamton, N.Y.

[22] Filed: July 17, 1974

[21] Appl. No.: 489,407

[52] U.S. Cl. .................................. 179/1 A; 317/31; 317/36 TD; 317/33 R
[51] Int. Cl.² ...................... H02H 3/20; H02H 7/20
[58] Field of Search ........... 179/1 A; 330/51, 207 P; 317/33 R, 31, 36 TD; 307/202; 325/478

[56] References Cited
UNITED STATES PATENTS

| | | | |
|---|---|---|---|
| 3,332,021 | 7/1967 | Hedlvnd | 325/478 |
| 3,350,650 | 10/1967 | Kemper | 325/478 |
| 3,665,320 | 5/1972 | Ohsawa | 325/478 |
| 3,691,427 | 9/1972 | Honda et al. | 317/36 TD |
| 3,721,861 | 3/1973 | Corderman | 317/31 |
| 3,727,107 | 4/1973 | Fujie | 330/207 P |
| 3,731,153 | 5/1973 | Nishimoto | 317/33 R |
| 3,828,267 | 8/1974 | Tsurushima | 330/51 |
| 3,835,412 | 9/1974 | Honda et al. | 317/33 R |
| 3,840,820 | 10/1974 | Kawada | 330/51 |

Primary Examiner—Kathleen H. Claffy
Assistant Examiner—E. Matt Kemeny
Attorney, Agent, or Firm—Elliott I. Pollock

[57] ABSTRACT

In an amplification system comprising an amplifier, a loudspeaker, normally open contacts connected in series between the amplifier and the speaker, and a power supply for the amplifier having relatively long buildup and decay times of its output voltage in response respectively to the connection and disconnection of the power supply to and from the a.c. line, means are provided responsive to the connection of the power supply to the a.c. line for delaying the closing of the normally open contacts until after the power supply voltage has built up to its full operating potential for eliminating the transient audio signals from the amplifier associated with power supply voltage buildup from being reproduced by the loudspeaker. Means are also provided for opening the contacts quickly after the power supply is disconnected from the a.c. line for eliminating the distorted audio signals from the amplifier associated with power supply decay from being reproduced by the loudspeaker. Additionally, if the amplifier is of the balanced type which exhibits a zero d.c. output potential during normal operation, means are provided for quickly opening the contacts upon the occurrence of a high d.c. amplifier output potential of either polarity for protecting the loudspeaker.

9 Claims, 1 Drawing Figure

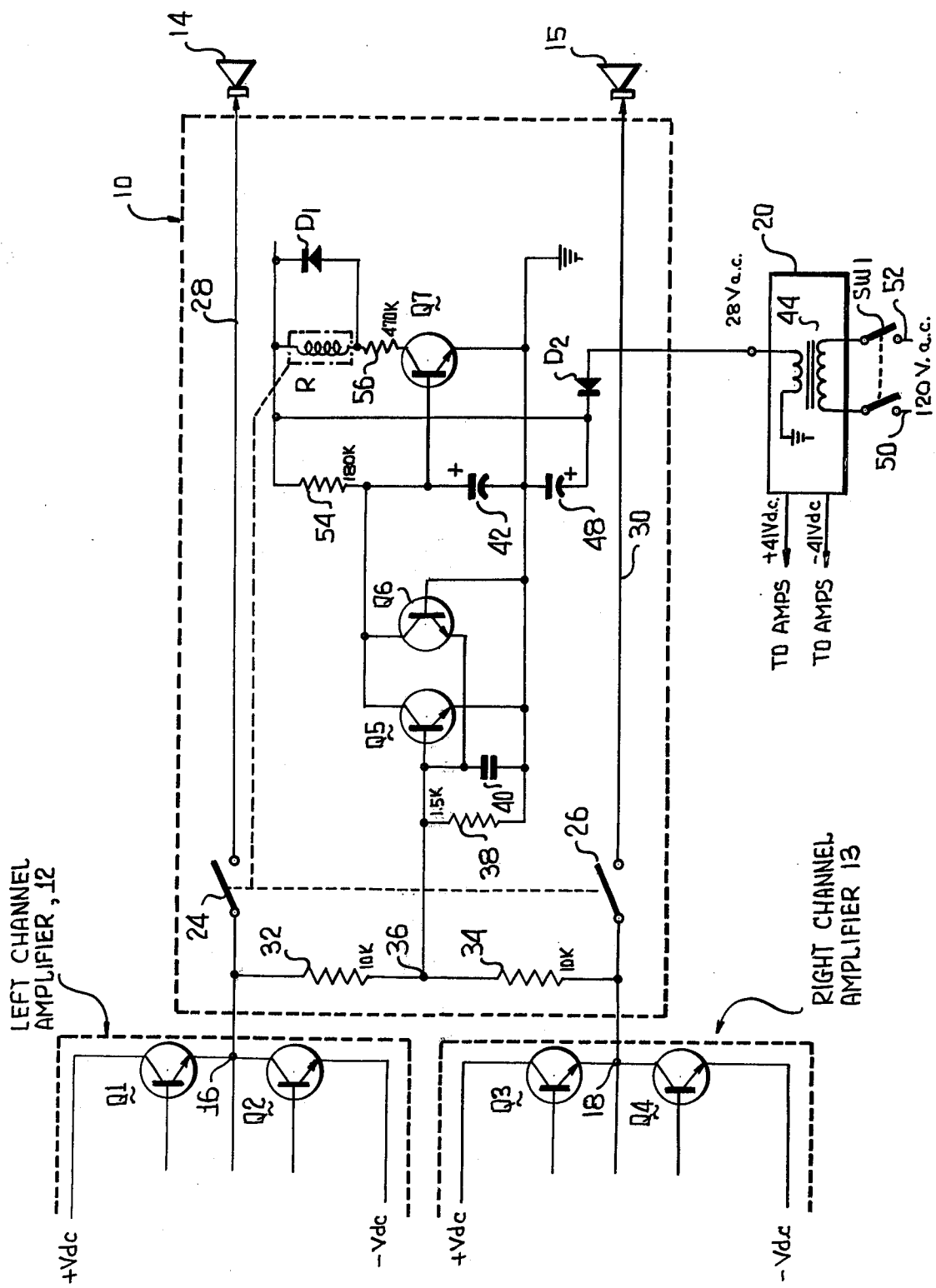

PROTECTIVE SYSTEM FOR STEREO LOUDSPEAKERS

BACKGROUND OF THE INVENTION

This invention relates to a circuit for controlling the connection of a loudspeaker to a transistor power amplifier and more particularly to a circuit both for disconnecting the loudspeaker from its amplifier to protect it from the excessive d.c. output voltages which may occur during amplifier malfunction, and for disconnecting the speaker during power supply buildup and decay to prevent the transient audio signals generated during these times from being reproduced by the speaker.

In the normal operation of a push-pull transistor power amplifier, the output terminal of the amplifier operates at a zero d.c. potential. This enables the loudspeaker to be directly d.c. coupled to the output circuit of the amplifier. Because of this direct d.c. connection, the speaker may become damaged if an output transistor of the amplifier breaks down or burns out and a high level d.c. voltage is delivered to the amplifier output terminal. The high d.c. voltage when delivered to the speaker may cause speaker damage through the abnormal distension of the driven element or driver coil burn-out.

The control circuit described hereinafter prevents damage to the speaker during such an amplifier malfunction by immediately disconnecting the speaker from the output terminal upon the occurrence of a high d.c. voltage of either polarity at the output terminal of the amplifier. This is accomplished by a transistor switching circuit which under normal amplifier operating conditions maintains normally-open relay contacts between the amplifier and the speaker closed. However, when a d.c. voltage of a predetermined magnitude is present at the output terminal of the amplifier, the switching circuit releases the relay contacts sufficiently quickly to prevent damage to the speaker.

Another common problem in amplification systems is one involving undesirable noise caused by the delay of the main power supply for the amplifier in either building up to its operating voltage, or returning to a zero voltage once the power supply is turned off. The long time required for the main power supply to reach operating voltage and to decay to zero voltage are primarily due to the time necessary to charge and discharge the filtering capacitors in the rectifier circuit of the main power supply.

As the main power supply voltage builds up, the amplifier circuits respond to the increasing power supply voltages by generating distorted audio output signals. These distorted audio signals are reproduced by the speaker if the speaker is connected to the amplifier during the power supply warm up period. Likewise, when the main power supply is turned off, decaying audio signals are generated by the amplifier as the power supply voltage decays. Additionally, switching transients occurring when the main power supply is switched on can be heard as a loud thump.

The distorted audio signals and/or power supply noise created during main power supply warm-up or shut down are prevented from reaching the speaker by disconnecting the speaker during these times. In the case of the warm-up noise, the closing of the normally open contacts between the loudspeaker and the amplifier is delayed by an RC timing circuit for a time exceeding the expected warm-up time for the main power supply. With respect to the noise generated when the main power supply for the amplifier is shunt off, the relay contacts between the speaker and the amplifier are quickly opened upon disconnecting the main power supply from the a.c. line. This prevents distorted signals from being reproduced by the speaker. For this purpose, the control circuit derives its only source of power from an auxiliary a.c. power supply having a substantially zero buildup and decay time, so that when the main power supply switch is opened power to the control circuit is immediately removed, thus deactivating the relay. The buildup and decay time constants of the auxiliary power supply are short compared to those of the main power supply so that the speaker is disconnected from the amplifier output terminal prior to any substantial decay of the output voltage from the main power supply. Thus, the distorted signals from the amplifier during the decay of the main power supply are prevented from reaching the loudspeaker.

SUMMARY OF THE INVENTION

What has, therefore, been provided is a circuit for disconnecting the loudspeaker of an amplifying system from its amplifier during the buildup or decay of output voltage from the main power supply for the amplifier, in which the loudspeaker is protected against high d.c. voltages caused by breakdown or burn out of amplifier components, employing a single relay which provides loudspeaker protection against high d.c. voltage and also provides that the speaker be disconnected from its amplifier during power supply buildup and decay.

BRIEF DESCRIPTION OF THE DRAWING

The sole drawing is a schematic circuit diagram illustrating the preferred embodiment of the invention.

DETAILED DESCRIPTION

Referring now to the sole FIGURE, a control circuit 10 is interposed between the output sections of left and right stereo transistor power amplifiers 12 and 13 and left and right speakers 14 and 15.

The output sections of amplifiers 12 and 13 are illustrated as including pairs of high power transistors Q1, Q2, Q3, and Q4 and provide that each of the output terminals 16 and 18 of the amplifiers normally operate at or close to zero d.c. potential. Direct current potentials of equal and opposite polarities are applied respectively to transistors Q1, Q2 and Q3, Q4, from a main power supply 20 which, because it contains large filter capacitors (not illustrated) in its rectifying circuit, has a relatively long output voltage buildup and decay characteristic.

In the event of a breakdown in or overdrive of the output section, it is possible that one or more of the power transistors will break down, which applies the positive or negative power supply potential to an amplifier output terminal.

If a loudspeaker is directly coupled to the output terminal at which this d.c. potential is present, an energy pulse may damage the loudspeaker by, for instance, distending its driven element. If the potential is applied for any length of time, the speaker becomes physically distorted, or the speaker coil will burn out, or catch fire.

In order to prevent this occurrence, normally open relay contacts 24 and 26 are interposed in lines 28 and 30 between the speakers and their respective amplifiers. Control circuit 10 maintains the contacts closed while the power supply is on, during normal operation. However, should a high d.c. voltage condition occur, control circuit 10 disconnects the loudspeakers by opening contacts 24 and 26 before a loudspeaker is damaged.

For this purpose, control circuit 10 is connected to the output terminals of amplifiers 12 and 13 via a resistor network composed of resistors 32 and 34 connected in series between output terminals 16 and 18. The midpoint 36 of this network in normal operation is at zero d.c. potential. If there is a d.c. potential at either output terminal 16 or 18, either resistor 32 or resistor 34 in series with a resistor 38 to ground forms a voltage dividing network with a non-zero d.c. voltage appearing at point 36. The values of resistors 32, 34 and 38 set the d.c. level at which the control circuit will respond.

Transistor Q5 responds to positive d.c. voltages at point 36 to turn off transistor Q7 by placing the base and emitter of transistor Q7 at the same potential. This de-energizes the relay coil R connected in series with transistor Q7, assuming it had previously been energized, and contacts 24 and 26 open. Transistor Q6 responds to negative d.c. voltages at point 36 to turn off transistor Q7, again by placing the emitter and base of transistor Q7 at the same potential.

More specifically, the base of transistor Q5 and the emitter of transistor Q6 are connected to point 36. The collectors of these two transistors are interconnected and connected to the base of transistor $Q_7$, the emitter of transistor $Q_5$ and the base of transistor $Q_6$ being returned to ground. A capacitor 40 is connected between point 36 and ground to shunt any audio frequency signals at point 36 away from either transistor $Q_5$ or $Q_6$, and to supply bias for $Q_5$, $Q_6$ in response to d.c. at terminal 36. In this manner audio signals do not affect the operation of the circuit, but d.c. voltages can.

In normal operation transistors $Q_5$ and $Q_6$ are OFF, and capacitor 42 connected between the base of transistor $Q_7$ and ground is charged. If a positive d.c. voltage of sufficient magnitude appears at the base of transistor $Q_5$, transistor $Q_5$ will be turned ON and the base of transistor $Q_7$ will be grounded through transistor $Q_5$. This quickly discharges capacitor 42 to remove the forward bias on transistor $Q_7$ and transistor $Q_7$ quickly turns OFF. If a negative d.c. voltage of sufficient magnitude appears at the emitter of transistor $Q_6$, transistor $Q_6$ is turned ON, connecting the base of transistor $Q_7$ to ground through transistor $Q_6$. Thus, the forward bias on the base of transistor $Q_7$ is removed. In either case transistor $Q_7$ is rapidly turned off responsive to the appearance of a d.c. potential of either polarity at point 36, and relay coil R is rapidly de-energized. The rapid de-energization of relay coil R is further enhanced by diode $D_1$ which discharges energy stored in the coil after deenergization, and prevents damage to Q7.

Power to control circuit 10 is provided by an auxiliary rectifier power supply, switched on with the main power supply, including a stepdown transformer 44, one side of which is grounded, a diode $D_2$, and a smoothing capacitor 48. This auxiliary power supply directly couples stepped down a.c. line current from lines 50 and 52 through DPST switch $SW_1$, the main power supply switch, through stepdown transformer 44 to the anode of diode $D_2$. In this embodiment 28 VAC is delivered to the anode of diode $D_2$. The cathode of diode $D_2$ is connected to ground through smoothing capacitor 48, such that a half wave rectified voltage appears at the cathode of diode $D_2$. This voltage is applied across a series-connected RC timing circuit comprising a resistor 54 and capacitor 42, the RC circuit having a midpoint connected to the base of transistor $Q_7$.

Initially transistor $Q_7$ is OFF, with no potential at its base. When switch $SW_1$ is closed, charge begins to build up on capacitor 42 until such time as transistor $Q_7$ is turned ON. This activates relay coil R, which closes contacts 24 and 26, thus connecting the speakers to their respective amplifiers. The delay in the turn on of transistor $Q_7$ is determined by the values of resistor 54 and capacitor 42, and in general is set longer than the expected main power supply build up time described hereinabove. This delays the connection of the speakers and prevents distorted audio signals due to the build up of the main power supply from being reproduced by the speakers.

The half wave rectified a.c. voltage from the cathode of diode $D_2$ is used to energize relay coil R, as well as providing operating potential for the control circuit in that rectified voltage is delivered through relay coil R, resistor 56 and transistor $Q_7$ to ground to energize the relay coil R.

Because the 28 VAC is directly coupled through stepdown transformer 44 to the a.c. line, the opening of the power supply switch $SW_1$ results in the 28 VAC removed from the anode of diode $D_2$ with a negligible delay. Upon removal of the a.c. from diode $D_2$, capacitor 48 is rapidly discharged. This is because capacitor 48 is kept relatively small as compared to the total capacitance in the main power supply and the discharge path through relay coil R, resistor 56 and transistor $Q_7$ has a relatively low resistance, resulting in an almost instantaneous opening of contacts 24 and 26 upon disconnecting the main power supply from the a.c. line.

The rapid charging and discharging of capacitor 48 gives the auxiliary power supply formed by capacitor 48, diode $D_2$ and transformer 44 relatively short output voltage build up and decay times as compared to those of the main power supply. Thus the throwing of the main power supply switch SW1 to its open position disconnects the speakers 14, 15 prior to any significant decay of the main power supply 20, with the result that no noise or distorted audio signal is reproduced by the speakers.

What has thus been provided is a circuit which performs three functions. Not only is loudspeaker protection provided, but the delayed speaker connection during power supply warm up and the rapid speaker disconnection during power supply shut down provides a particularly clean operating characteristic for the overall audio reproduction system.

What is claimed is:

1. In an amplification system, an amplifier a load, normally open contacts connected in series between said amplifier and said load, a rectifier power supply, a source of a.c. power, switch means for at will connecting said rectifier power supply to said source of a.c. power, said rectifier power supply having relatively long build-up and decay times of its output voltage responsive respectively to opening and closing of said switch means, means responsive to closing of said switch means for closing said normally open contacts with a time delay at least as great as said build-up time and for opening said contacts after only a relatively short time delay in response to opening of said switch means, wherein said amplifier has a substantially zero d.c. potential output during normal operation of said amplifier and a d.c. potential output of at least a predetermined level during an abnormal operating condition of said amplifier, said system further including means responsive to a d.c. potential output of at least said predetermined level for opening said contacts, wherein said amplifier has an output terminal and wherein said last mentioned means includes an auxiliary power supply, one side of said auxiliary power supply being grounded, a relay coil for controlling said contacts, a semiconductor switch having a control terminal, means for connecting said relay coil and said semiconductor switch in series across said auxiliary power supply, first and second transistors having intercollectors connected to said control terminal, a voltage dividing network connected between the output terminal of said amplifier and ground, said voltage dividing network having a midpoint, means for connecting the midpoint of said voltage dividing network to the base of said first transistor and the emitter of said second transistor, means for connecting the base of said second transistor to ground, a capacitor, and means for connecting said capacitor between the base of said first transistor and ground.

2. The amplification system according to claim 1 wherein said load includes a loudspeaker.

3. The amplification system according to claim 1, wherein said means for opening and closing said contacts further includes timing means connected to said auxiliary power supply, said timing means including means activated in response to the coupling of said auxiliary power supply to said a.c. power source through said switch means for turning on said semiconductor switch with a time delay at least as great as said build-up time.

4. The amplification system according to claim 3 wherein said timing means includes an RC circuit connected in series across said auxiliary power supply, and means for connecting the midpoint of said RC circuit to the control terminal of said semiconductor switch.

5. The apparatus according to claim 1, wherein said means for delaying the closing of said normally open contacts includes an RC timing circuit.

6. The combination according to claim 1 wherein is provided a common a.c. transformer connected between an a.c. power line and said power supplies, and wherein said switch means connects said a.c. transformer to supply a.c. power to both of said power supplies.

7. In combination, a transistor power amplifier having an output terminal at which a zero d.c. potential exists during normal operation of said amplifier, said output terminal having a d.c. potential of at least a predetermined level in response to malfunction of said amplifier, a main power supply connected to supply operating d.c. power to said amplifier, said main power supply having relatively long build up and decay times of its output voltage in response respectively to the turning on and off of said power supply, a loudspeaker, normally open contacts for connecting said loudspeaker to said output terminal, means responsive to the turning on of said main power supply for closing said normally open contacts with a time delay at least as great as said build up time and for opening said contacts within a time after the turning off of said main power supply which is short in comparison to the decay time of said power supply, means for opening said contacts substantially instantaneously in response to the occurrence of said d.c. potential of at least said predetermined level at said output terminal, said last-named means including first semiconductor switch means turned on in response to the d.c. potential at said output terminal reaching said predetermined level, a relay coil for opening said contacts, an auxiliary power source, second semiconductor switch means connected in series with said relay coil across said auxiliary power source, said second semiconductor switch means being rendered nonconductive by the turn on of said first semiconductor switch means, said auxiliary power source including a rectified voltage source having a grounded and ungrounded side, and said first semiconductor switch means including a pair of transistors with interconnected collectors, the base of a first transistor of said pair being connected to the emitter of the second transistor of said pair, resistor means coupled between said output terminal and the base of said first transistor and ground, and means for connecting said interconnected collectors to said second transistor switch means and to the ungrounded side of said rectified voltage source.

8. The apparatus according to claim 7 wherein said second semiconductor switch means includes a third transistor having its base connected to said interconnected collectors, its emitter grounded, and its collector connected to one end of said relay coil, and means for connecting the other end of said relay coil to the ungrounded side of said rectified voltage source.

9. The apparatus according to claim 8 wherein said means for connecting said interconnected collectors and the base of said third transistor to said rectified voltage source includes an RC circuit connected in series across said rectified voltage source, the midpoint of said series connected RC circuit being connected to the base of said third transistor and said interconnected collectors.

* * * * *